March 15, 1966 R. WOLFSON ETAL 3,240,944

CIRCUIT FOR IMPROVING THE FREQUENCY RESPONSE
OF PHOTOELECTRIC DEVICES
Filed May 11, 1962

INVENTORS
RICHARD WOLFSON
ISRAEL L. FISCHER
BY
ATTORNEY 3,240,944

CIRCUIT FOR IMPROVING THE FREQUENCY RESPONSE OF PHOTOELECTRIC DEVICES

Richard Wolfson, Teaneck, and Israel L. Fischer, Harrington Park, N.J., assignors to The Bendix Corporation, Teterboro, N.J., a corporation of Delaware Filed May 11, 1962, Ser. No. 193,988
13 Claims. (Cl. 250—214)

The invention relates generally to photoelectric devices and more particularly to a circuit for improving the frequency response of photoelectric devices to pulsating light signals.

Photoelectric devices convert light signals into electric signals. Photoelectric devices are not sensitive to the frequency of pulsating light signals below a predetermined or "cutoff" frequency but are frequency sensitive above the predetermined frequency in that the corresponding electrical signals become smaller, distorted, and unusuable. The predetermined or "cutoff" frequency is the frequency at which the output signal is .707 of its maximum value and may vary from one kilocycle to as high as one megacycle depending upon the type and construction of the photoelectric device. A chart listing cutoff frequencies of several photoelectric devices may be found in Hunter, Handbook of Electronics, c.f. pp. 5–8, McGraw-Hill (1956).

Below the predetermined or cutoff frequency, the photoelectric device provides usable electrical signals which are linearly proportional to the amplitude of the signals, but above the predetermined frequency the linear relationship between the light signals and electrical signals no longer exists.

One object of the invention is to provide a novel circuit using a photoelectric device for extending the usable range of the photoelectric device.

Another object of the invention is to provide a novel circuit including a photoelectric device for providing electrical signals corresponding to the shape, amplitude and time phase of light signals applied to the photoelectric device.

Another object of the invention is to provide a novel circuit including a photoelectric device for providing electrical signals corresponding to the exact shape, relative amplitude, and time phase of random light signals applied to the photoelectric device.

Another object of the invention is to provide a circuit including a photoelectric device for providing a substantially flat frequency response considerably beyond the cutoff frequency of the photoelectric device.

Another object of the invention is to provide a circuit including a photoelectric device to compensate for the slope of the frequency response curve of the photoelectric device beyond the cutoff frequency so that the circuit frequency response curve has zero slope well beyond the cutoff frequency.

The invention contemplates a circuit including a photoelectric device for extending the usable frequency range of the photoelectric device beyond its cutoff frequency, an amplifier connected to the photoelectric device and having a rising gain characteristic and a low frequency break point at cutoff frequency providing an output over a frequency range extending well beyond the cutoff frequency.

The foregoing and other objects and advantages of the invention will appear more fully hereinafter from a consideration of the detailed description which follows, taken together with the accompanying drawings wherein one embodiment of the invention is illustrated by way of example. It is to be expressly understood, however, that the drawings are for illustration purposes only and are not to be construed as defining the limits of the invention.

Figure 1:
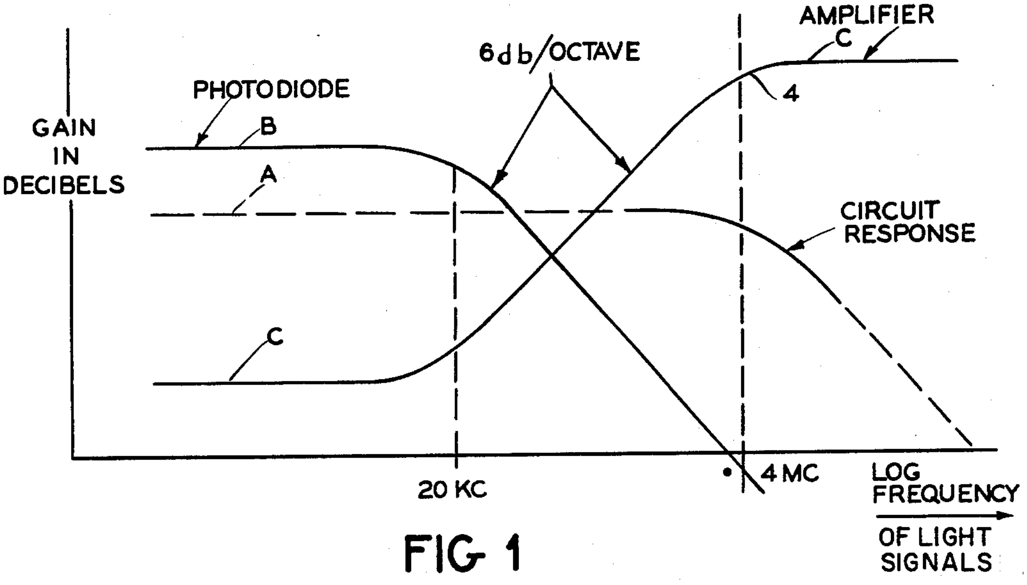
FIGURE 1 shows in curve A the frequency response of a circuit constructed according to the invention and in curves B and C the separate responses of the photoelectric device and the amplifier used in the circuit.

In FIGURE 1, the log frequency of the light signals in cycles per second is plotted on the abscissa, and the gain in decibels is plotted on the ordinate. Curve B is the frequency response curve of a typical photoelectric device, which, for example, may be a Texas Instrument NPN diffused silicon photo-duo-diode type 1N2175. The frequency response is substantially flat up to 20 kilocycles, the cutoff frequency of the diode, and then from this point the gain decreases or has a roll off of 6 db per octave.

Figure 2:
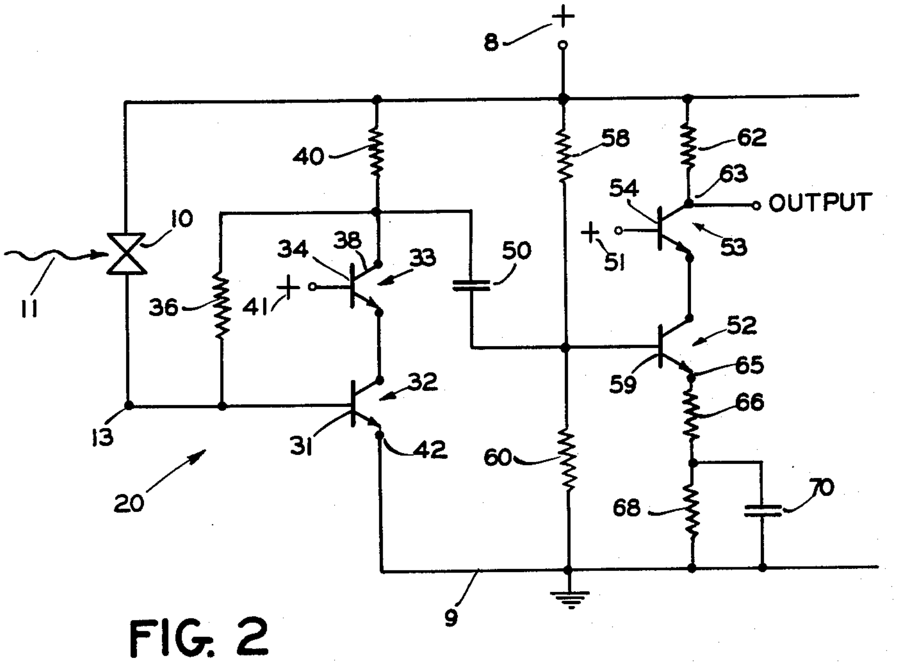
FIGURE 2 is a schematic diagram of a novel circuit including a photoelectric device and an amplifier constructed in accordance with the invention.

Curve C is the frequency response curve of the amplifier 20 shown in FIGURE 2 and the curve shows mid-frequency gain increase at 6 db per octave, with a lower break frequency at the cutoff frequency of the diode, 20 kc. An upper break frequency 4 of the amplifier is shown on curve C considerably beyond the cutoff frequency of the diode and occurs, for example, at .4 megacycle.

Curve A is the frequency response curve of the circuit of FIGURE 2, and is a composite of the frequency response curves B and C. The frequency response of the circuit of FIGURE 2 shown in curve A is substantially flat from very low frequencies up to the upper break frequency 4 of the amplifier.

The novel circuit constructed in accordance with the invention and shown in FIGURE 2 comprises a source of direct current electrical potential 8 connected to a photoelectric device 10 which, for example, may be the 1N2175 diode referred to above. A light signal 11 falling on diode 10 provides a current signal at terminal 13 as shown in curve B of FIGURE 1 which is applied to the input of amplifier 20.

The signal from the photodiode 10 is applied from terminal 13 to a base 31 of a transistor 32 connected in cascode with a transistor 33. A resistor 36 connected from a collector 38 of transistor 33 to base 31 of transistor 32 provides bias; and a resistor 40 connecting collector 38 with potential source 8 acts as a load. A second source of direct current potential 41 is applied to base 34 of transistor 33, causing the transistor 33 to conduct. The purpose of the cascode arrangement is to eliminate, or compensate for, the Miller capacitance of transistor 32. Emitter 42 of transistor 32 is coupled to a reference, shown here as ground, potential 9.

An output signal from transistors 32 and 33, available at collector 38, is applied through a coupling capacitor 50 to a second pair of transistors 52 and 53 connected in cascode. Transistor 53, like transistor 33, is rendered conducting by a direct current source of potential 51 applied at its base terminal 54. Resistor 58, connecting potential source 8 and a base 59 of the transistor 52, and a resistor 60, connecting base 59 to ground 9, form a bias network for transistor 52. Resistor 62 connecting collector 63 of transistor 53 to power supply 8 acts as a load. A network comprising a resistor 66, serially connected with a parallel combination of a resistor 68 and a capacitor 70 connects emitter 65 of transistor 52 to ground 9 and provides frequency compensation and fixes the low frequency and high frequency break points of the amplifier. Capacitor 70 is of such size as to present an open circuit for frequencies below the cutoff frequency of diode 10, and a short circuit for frequencies in excess of the cutoff frequency.

There are many different values of circuit parameters for which the circuit shown in FIGURE 2 will function satisfactorily. Since the circuit parameters may vary according to the design for any particular application, the following circuit parameters are included for the circuit of FIGURE 2 by way of example only.

| | |
|---|---|
| Diode **10** | 1N2175. |
| All transistors | 2N760. |
| Resistors: | |
| **36** | 500K ohms. |
| **40** | 10K ohms. |
| **58** | 22K ohms. |
| **60** | 2.2K ohms. |
| **62** | 10K ohms. |
| **66** | .5K ohms. |
| **68** | 10K ohms. |
| Capacitors: | |
| **50** | .05 microfarad. |
| **70** | 820 micromicrofarads. |
| Source of electrical potentials **8** | +22 volts D.C. |
| Source of electrical potentials **41** and **51** | 6 volts D.C. |

In summary, there has been shown a novel circuit including a photoelectric device adapted to receive a light signal and provide an electrical signal having a frequency response substantially flat up to a predetermined frequency with a predetermined roll off for frequencies in excess of the predetermined frequency, and an amplifier connected to the photoelectric device providing a flat frequency gain response below the predetermined frequency and a rising response corresponding to the predetermined roll off for frequencies greater than the predetermined frequency, the circuit itself providing a constant gain over a frequency range extending well beyond the cutoff frequency.

Although but a single embodiment of the invention has been illustrated and described in detail, it is to be expressly understood that the invention is not limited thereto. Various changes may also be made in the design and arrangement of the parts without departing from the spirit and scope of the invention as the same will now be understood by those skilled in the art.

What is claimed is:

1. A circuit for extending the usable light signal frequency range of a photoelectric device beyond its light signal cutoff frequency comprising a photoelectric device having a light signal cutoff frequency, an amplifier connected to the photoelectric device and having means for providing a rising input signal vs. frequency gain characteristic with a low frequency break point substantially at the light signal cutoff frequency of the photoelectric device so that the circuit provides a substantially uniform output over a frequency range extending well beyond the light signal cutoff frequency.

2. A circuit for extending the usable light signal frequency range of a photoelectric device beyond its light signal cutoff frequency, comprising (a) a photoelectric device having a light signal cutoff frequency and adapted to receive light signals and provide electrical signals corresponding thereto, (b) an amplifier with rising input signal gain in frequency mid-band having a low frequency break point substantially at the light signal cutoff frequency of the photoelectric device, and (c) coupling means for applying the electric signals from the photoelectric device to the amplifier, the circuit providing substantially constant output over a frequency range extending well beyond the light signal cutoff frequency.

3. A circuit for extending the usable light signal frequency range of a photoelectric device beyond its light signal cutoff frequency, comprising (a) a photoelectric device having a light signal cutoff frequency and adapted to receive light signals and provide electrical signals corresponding thereto, (b) an amplifier with rising input signal gain in frequency mid-band having a low frequency break point at the light signal cutoff frequency of the photoelectric device and having a high frequency break point, and (c) coupling means for applying the electric signals from the photoelectric device to the amplifier, the circuit providing constant gain over a frequency range extending to the high frequency break point.

4. A circuit of the kind defined in claim 3 in which the amplifier has two stages of cascode amplifiers, and a frequency compensation network in the second stage for fixing the low frequency break point.

5. An electrical circuit comprising a photoelectric device having a light signal vs. frequency response substantially flat up to a predetermined light signal frequency and having a decreasing response above the predetermined light signal frequency, said photoelectric device receiving light signals and providing electrical signals corresponding thereto, and an amplifier connected to the photoelectric device and having means for providing rising input signal gain in frequency mid-band beginning at the predetermined light signal frequency and an upper frequency break point considerably higher than the predetermined light signal frequency to compensate for decreasing response to the photoelectric device.

6. An electrical circuit comprising a photoelectric device adapted to receive light signals and provide electrical signals having a light signal vs. frequency response substantially flat up to a predetermined light signal frequency with a predetermined roll off for light signal frequencies in excess of the predetermined light signal frequency, an amplifier connected to the photoelectric device and having means for providing a flat frequency response below the predetermined light signal frequency and a rising response corresponding to the predetermined roll off for frequencies greater than the predetermined light signal frequency so that the overall output of the electrical circuit is substantially uniform well beyond the roll off frequency.

7. An electrical circuit comprising a photoelectric device adapted to receive a light signal and provide an electrical signal having a light signal vs. frequency response substantially flat up to a predetermined light signal frequency with a roll off of 6 db per octave for light signal frequencies in excess of the predetermined light signal frequency, an amplifier connected to the pohtoelectric device providing a flat frequency response below the predetermined light signal frequency and a rising response of 6 db per octave for frequencies greater than the predetermined light signal frequency.

8. A circuit comprising a two terminal photoconductive device adapted to change resistance in accordance with light signals, a source of electrical potential connected to one terminal of the photoconductive device and the device providing a current signal in accordance with its resistance, an amplifier having first, second, third, and fourth transistors, each transistor having a base, an emitter, and a collector, the first transistor having its base connected to the other terminal of the photoconductive device for receiving the current signal, its emitter connected to a reference and its collector connected to the emitter of the second transistor, load means connecting the collector of the second transistor to the potential source, biasing means including a resistor connecting the collector of the second transistor and the base of the first transistor, a biasing potential applied to the base of the second transistor, a coupling capacitor joining the collector of the second transistor to the base of the third transistor, coupling means connecting the emitter of the fourth transistor to the collector of the third transistor, another biasing means including a resistor connecting the base of the third transistor to the source, another load means including a resistor connecting the collector of the fourth transistor to the source, means for biasing the fourth transistor conducting, and an electrical network including a parallel combination of a resistor and a capacitance serially connected with another resistor between the emitter of the third transistor and the reference potential.

9. A circuit for extending the usable light signal frequency range of a photoelectric device beyond its light signal cutoff frequency, comprising a photoelectric device receiving light signals and providing electrical signals corresponding thereto and characterized by decreasing electrical signal amplitude beyond the light signal cutoff frequency, an amplifier connected to the photoelectric device for receiving the electrical signals and having rising input signal vs. frequency gain characteristics and having means for providing a low frequency break-point substantially at the light signal cutoff frequency of the photoelectric device, the rising gain characteristics of the amplifier corresponding to the decreasing signal amplitude and compensating for the decreasing signal amplitude to provide a substantially constant output over a frequency range extending well beyond the light signal cutoff frequency.

10. A circuit for extending the usable light signal frequency range of a photoelectric device beyond its light signal cutoff frequency, comprising a photoelectric device receiving light signals and providing electrical signals corresponding thereto and characterized by decreasing electrical signal amplitude beyond the light signal cutoff frequency, an amplifier having a pair of transistors connected in cascode and connected to the photoelectric device for receiving the electrical signals and having rising input signal vs. frequency gain characteristics with a low frequency break-point substantially at the light signal cutoff frequency of the photoelectric device, the rising gain characteristics of the amplifier corresponding to the decreasing electrical signal amplitude and compensating for the decreasing electrical signal amplitude to provide a substantially constant output over a frequency range extending well beyond the light signal cutoff frequency.

11. A circuit for extending the usable light signal frequency range of a photoelectric device beyond its light signal cutoff frequency, comprising a photoelectric device receiving light signals and providing electrical signals corresponding thereto and characterized by decreasing electrical signal amplitude beyond the light signal cutoff frequency, an amplifier connected to the photoelectric device for receiving the electrical signals and having rising input signal vs. frequency gain characteristics, a frequency compensation network providing a low frequency break-point substantially at the light signal cutoff frequency of the photoelectric device, the rising gain characteristics of the amplifier corresponding to the decreasing electrical signal amplitude and compensating for the decreasing electrical signal amplitude to provide a substantially constant output over a frequency range extending well beyond the light signal cutoff frequency.

12. A circuit for extending the usable light signal frequency range of a photoelectric device beyond its light signal cutoff frequency, comprising a photoelectric device receiving light signals and providing electrical signals corresponding thereto and characterized by decreasing electrical signal amplitude beyond the light signal cutoff frequency, an amplifier having a pair of transistors connected in cascode and connected to the photoelectric device for receiving the electrial signals and having rising input signal vs. frequency gain characteristics, a frequency compensation network providing a low frequency break-point substantially at the light signal cutoff frequency of the photoelectric device, the rising gain characteristics of the amplifier corresponding to the decreasing electrical signal amplitude and compensating for the decreasing electric signal amplitude to provide a substantially constant output over a frequency range extending well beyond the light signal cutoff frequency.

13. A circuit comprising a photoelectric device having a light signal cutoff frequency and adapted to receive light signals and provide electrical signals corresponding thereto, an amplifier with rising input signal gain in frequency mid-band having a low frequency break point at the light signal cutoff frequency of the photoelectric device and having a high frequency break point, an amplifier having two stages of cascode amplifiers, the first stage of the amplifier including a first transistor having a base connected to the photoelectric device for receiving the electrical signal, an emitter, and a collector, a second transistor having an emitter connected to the collector of the first transistor, a base, and a collector, first biasing means including a resistor connecting the collector of the second transistor to the base of the first transistor, a source of electrical potential, a first load means connecting the source of electrical potential to the collector of the second transistor, another source of electrical potential applied to the base of the second transistor to provide bias, and the second stage of the amplifier including third and fourth transistors each having a base, an emitter, and a collector and having the emitter of the fourth transistor connected to the collector of the third transistor, second biasing means including a resistor connecting the source of potential to the base of the third transistor, a second load means connecting the collector of the fourth transistor to the source of electrical potential, another source of electrical potential applied to the base of the fourth transistor to provide bias, coupling means including a capacitor connecting the collector of the second transistor to the base of the third transistor for coupling the first stage to the second stage, a reference potential connected to the emitters of the first and third transistors, the connection between the reference potential and the third transistor including a resistor serially connected to a parallel combination of another resistor and a capaictor to provide frequency compensation and fix the low frequency break point, and coupling means for applying the electric signals from the photoelectric device to the amplifier, the circuit providing constant gain over a frequency range extending to the high frequency break point.

References Cited by the Examiner

UNITED STATES PATENTS

| | | | |
|---|---|---|---|
| 2,775,659 | 12/1956 | Nelson | 330—70 |
| 2,802,066 | 8/1957 | Woll | 330—70 |
| 2,964,637 | 12/1960 | Keizer | 250—211 |
| 2,974,290 | 3/1961 | Azelickis | 330—70 |
| 3,093,740 | 6/1963 | Buch | 250—207 |

RALPH G. NILSON, *Primary Examiner.*

WALTER STOLWEIN, *Examiner.*